United States Patent
Rofougaran

(10) Patent No.: US 9,378,907 B2
(45) Date of Patent: Jun. 28, 2016

(54) LIQUID MEMS COMPONENT RESPONSIVE TO PRESSURE

(71) Applicant: Broadcom Corporation, Irvine, CA (US)

(72) Inventor: Ahmadreza Rofougaran, Newport Coast, CA (US)

(73) Assignee: BROADCOM CORPORATION, Irvine, CA (US)

( * ) Notice: Subject to any disclaimer, the term of this patent is extended or adjusted under 35 U.S.C. 154(b) by 439 days.

(21) Appl. No.: 13/717,479

(22) Filed: Dec. 17, 2012

(65) Prior Publication Data
US 2014/0071583 A1    Mar. 13, 2014

Related U.S. Application Data

(60) Provisional application No. 61/699,183, filed on Sep. 10, 2012, provisional application No. 61/727,057, filed on Nov. 15, 2012.

(51) Int. Cl.
*H01H 29/00* (2006.01)
*H01H 29/02* (2006.01)
*B81B 3/00* (2006.01)
(Continued)

(52) U.S. Cl.
CPC ............ *H01H 29/004* (2013.01); *B81B 3/0032* (2013.01); *H01G 5/0132* (2013.01); *B81B 2201/018* (2013.01); *H01H 1/0036* (2013.01); *H01H 2029/008* (2013.01)

(58) Field of Classification Search
CPC H01H 29/004; H01H 2029/008; H01H 29/00
USPC ........... 200/513, 187, 211, 214, 182; 310/328
See application file for complete search history.

(56) References Cited

U.S. PATENT DOCUMENTS

| | | | | |
|---|---|---|---|---|
| 4,200,779 | A * | 4/1980 | Zakurdaev et al. | ........... 200/187 |
| 6,323,447 | B1 * | 11/2001 | Kondoh | ............... H01H 1/0036 200/182 |
| 6,515,404 | B1 * | 2/2003 | Wong | ................... H01H 1/0036 310/328 |

(Continued)

FOREIGN PATENT DOCUMENTS

| | | |
|---|---|---|
| CN | 1422433 A | 6/2003 |
| EP | 1214854 A1 | 6/2002 |

(Continued)

OTHER PUBLICATIONS

European Patent Office; European Search Report; EP Application No. 13004223.7; Nov. 6, 2014; 3 pgs.

Simon et al., "A Liquid-Filled Microrelay with a Moving Mercury Microdrop," Journal of Microelectromechanical Systems, vol. 6, No. 3, Sep. 1997; 9 pgs.

(Continued)

*Primary Examiner* — Eric Thomas
*Assistant Examiner* — Arun Ramaswamy
(74) *Attorney, Agent, or Firm* — Garlick & Markison; Bruce E. Garlick

(57) ABSTRACT

A liquid micro-electro-mechanical system (MEMS) component includes a board, a channel frame, a flexible channel side, a liquid droplet, and one or more conductive elements. The channel frame is within the board and mates with the flexible channel side to form a channel within the board. The liquid droplet is contained within the channel. When a pressure is applied to the flexible side, the shape of the liquid droplet is changed with respect to the one or more conductive elements thereby changing an operational characteristic of the liquid MEMS component.

20 Claims, 12 Drawing Sheets

(51) Int. Cl.
*H01G 5/013* (2006.01)
*H01H 1/00* (2006.01)

(56) References Cited

U.S. PATENT DOCUMENTS

| | | | |
|---|---|---|---|
| 2002/0105396 A1* | 8/2002 | Streeter et al. | 335/78 |
| 2004/0037708 A1 | 2/2004 | Murasato et al. | |
| 2004/0150939 A1 | 8/2004 | Huff | |
| 2012/0222944 A1 | 9/2012 | Kim et al. | |

FOREIGN PATENT DOCUMENTS

| | | |
|---|---|---|
| GB | 1106020 A | 3/1968 |
| GB | 1306221 A | 2/1973 |
| WO | 2012050938 A2 | 4/2012 |

OTHER PUBLICATIONS

Sen, P.; Chang-Jin Kim, "A Liquid-Metal RF MEMS Switch with DC-to-40 GHz Performance," Micro Electro Mechanical Systems, 2009. MEMS 2009. IEEE 22nd International Conference on, pp. 904-907, 25-29 Jan. 2009; 4 pgs.

Kondoh et al., "High-Reliability, High-Performance RF Micromachined Switch Using Liquid Metal," Journal of Microelectromechanical Systems, vol. 14, No. 2, Apr. 2005; 7 pgs.

Chung-Hao Chen; Peroulis, D., "Liquid RF MEMS Wideband Reflective and Absorptive Switches," Microwave Theory and Techniques, IEEE Transactions on, vol. 55, No. 12, pp. 2919-2929, Dec. 2007; 11 pgs.

Varadan, V. K., Vinoy, K.J. and Jose, K.A., "Microelectromechanical Systems (MEMS) and Radio Frequency MEMS, in RF MEMS and Their Applications," John Wiley & Sons, Ltd, Chichester, UK; pp. 1-49, May 2003; 49 pgs.

* cited by examiner

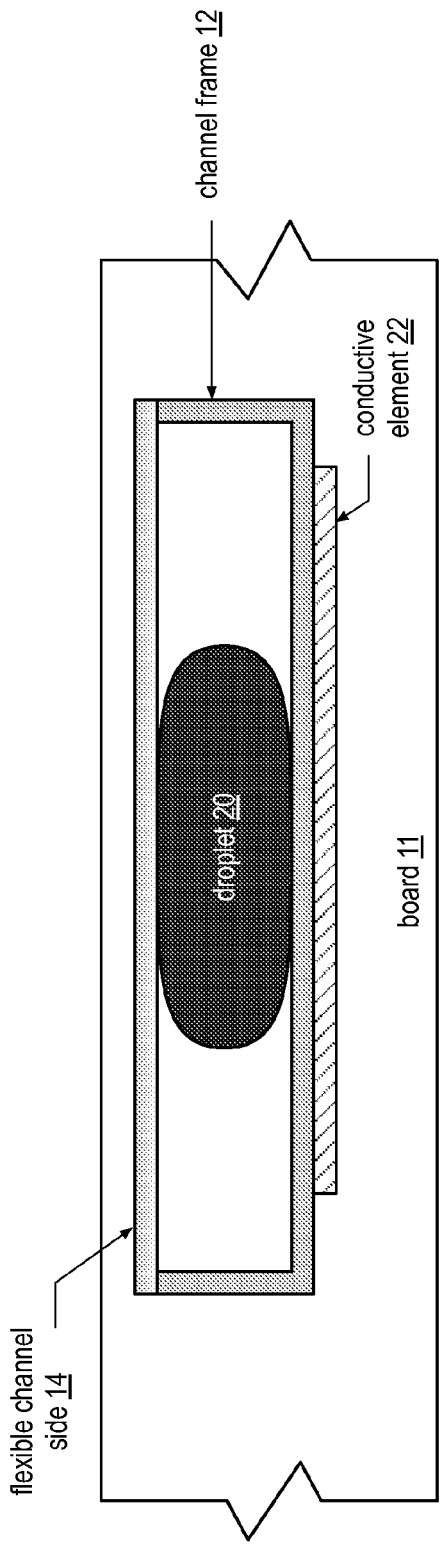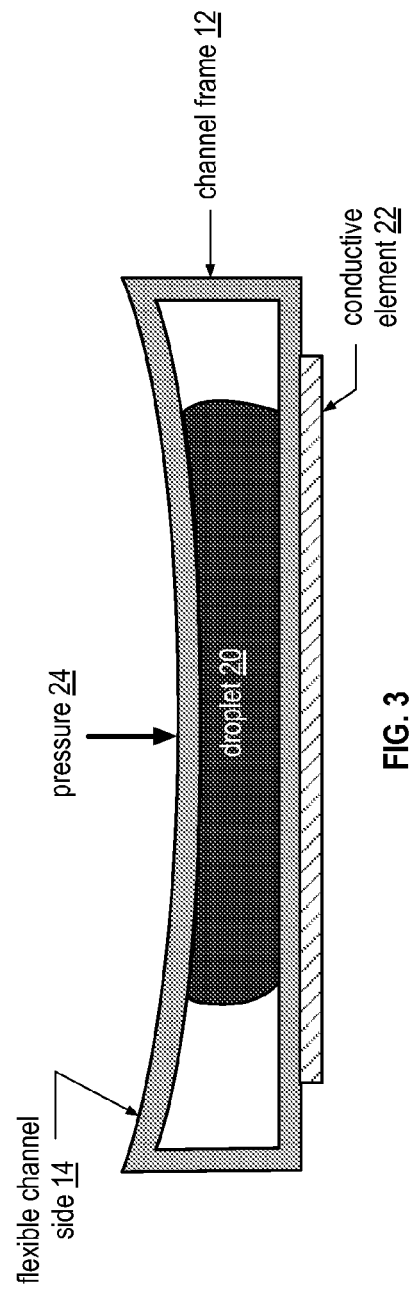

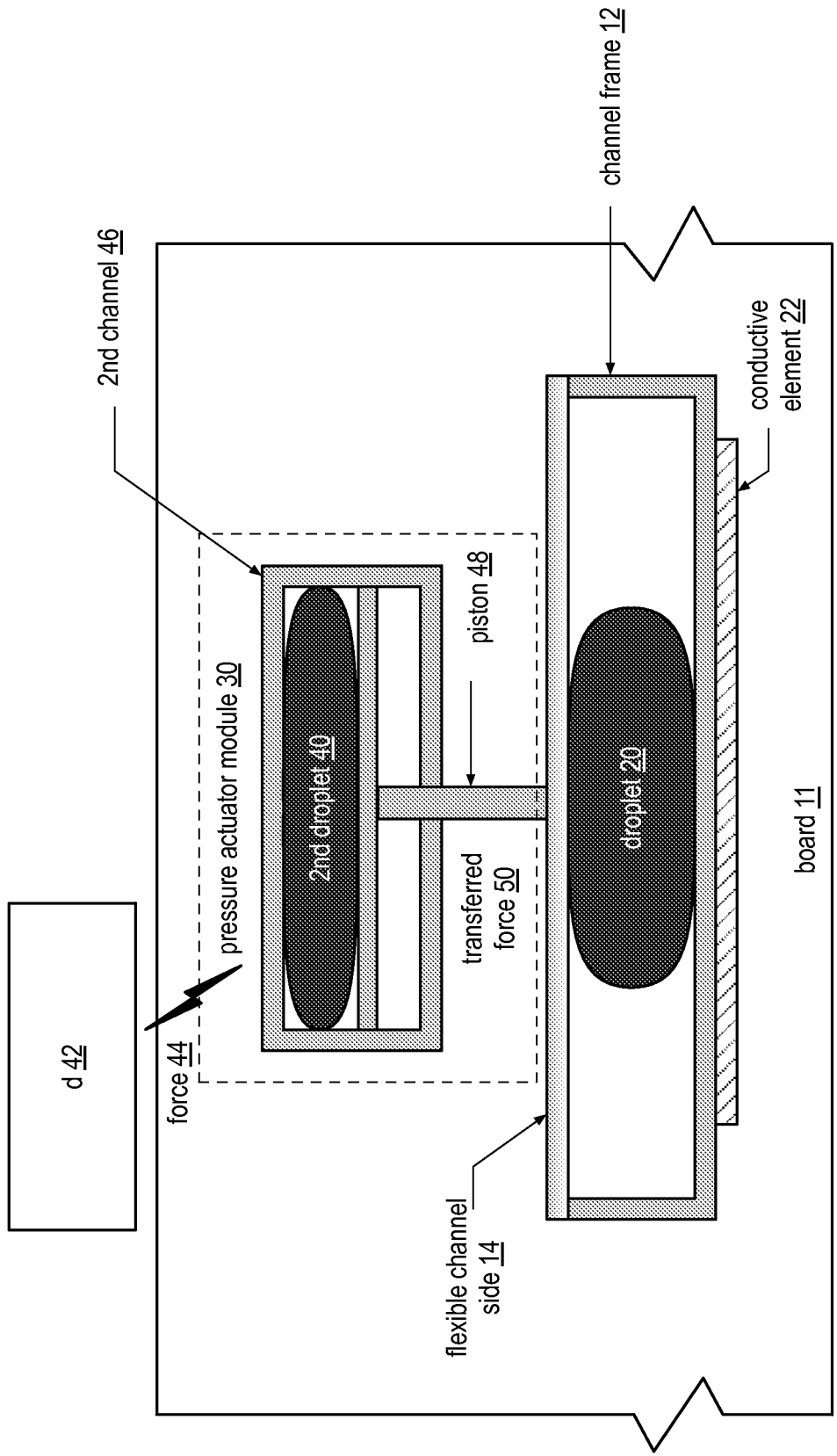

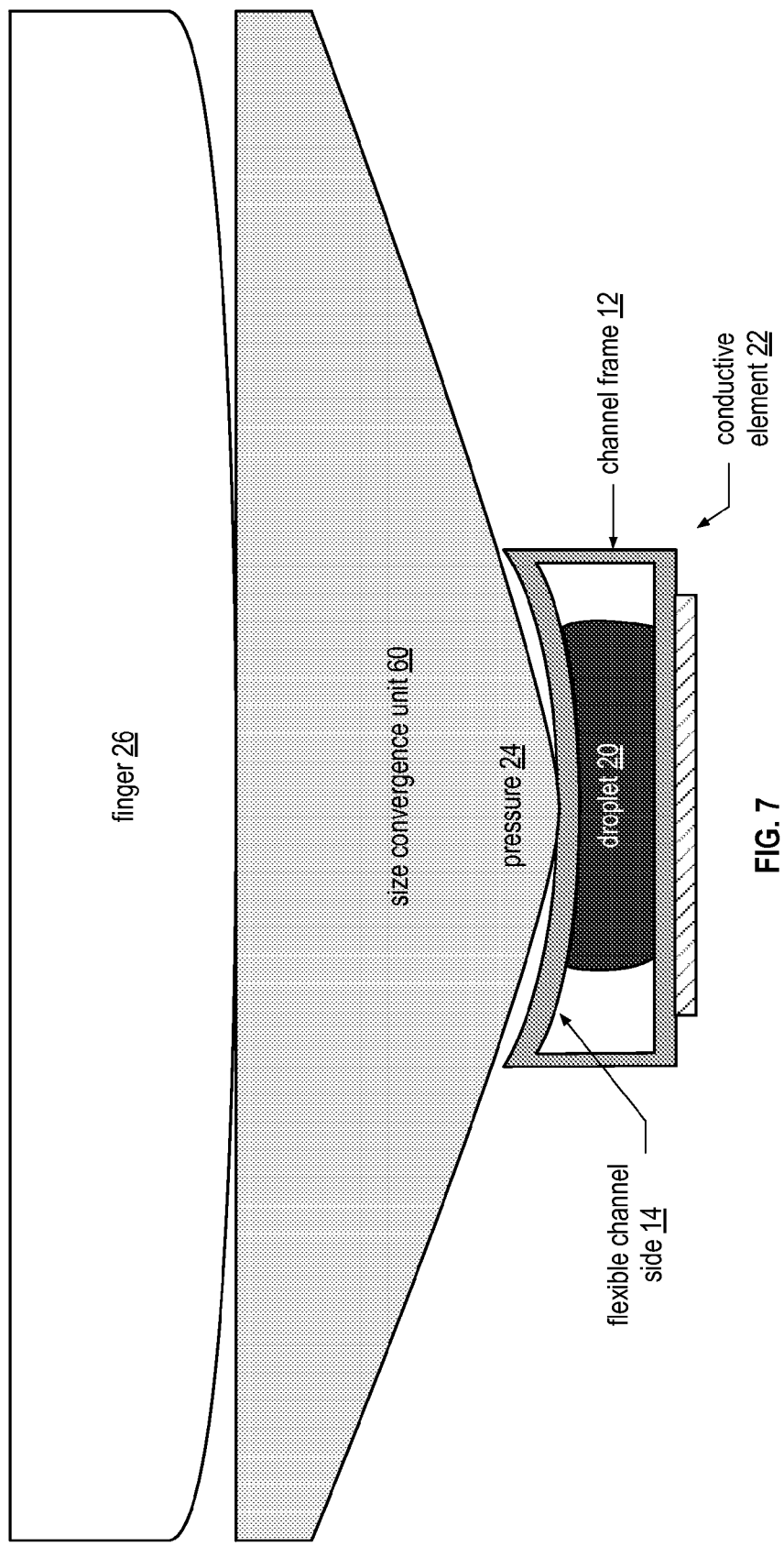

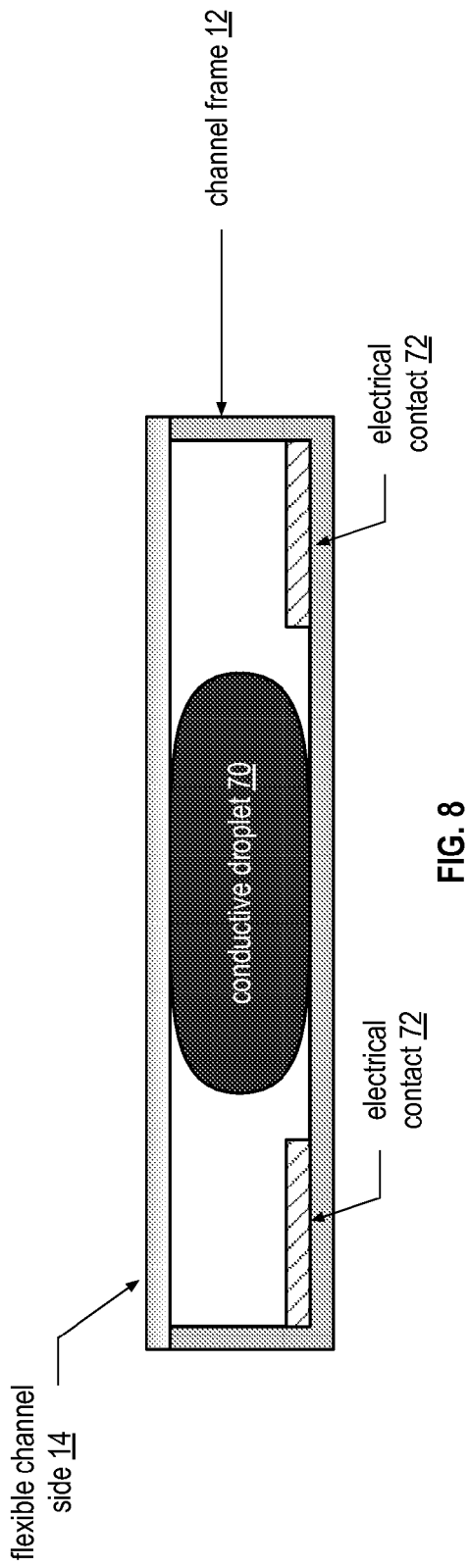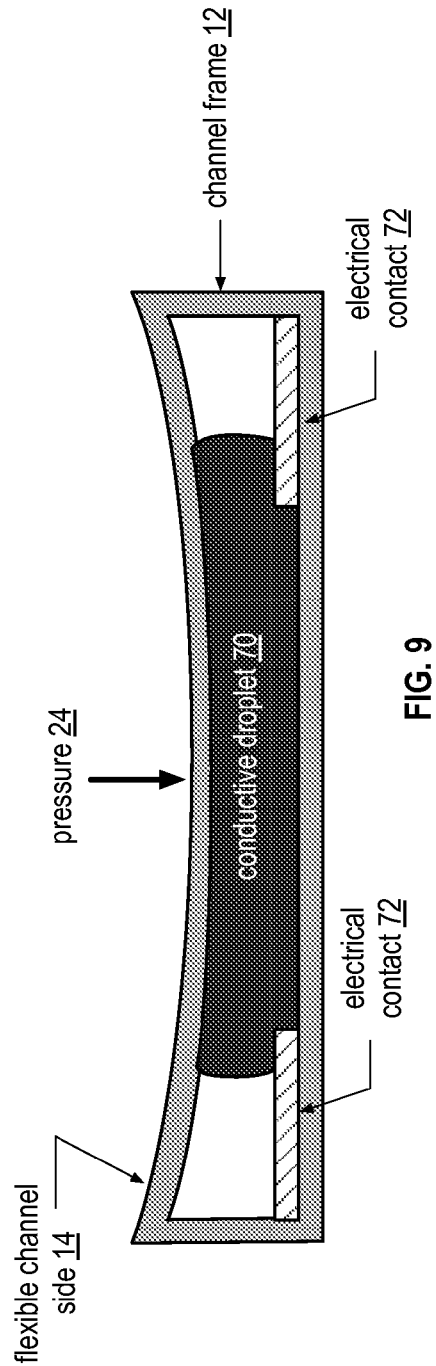

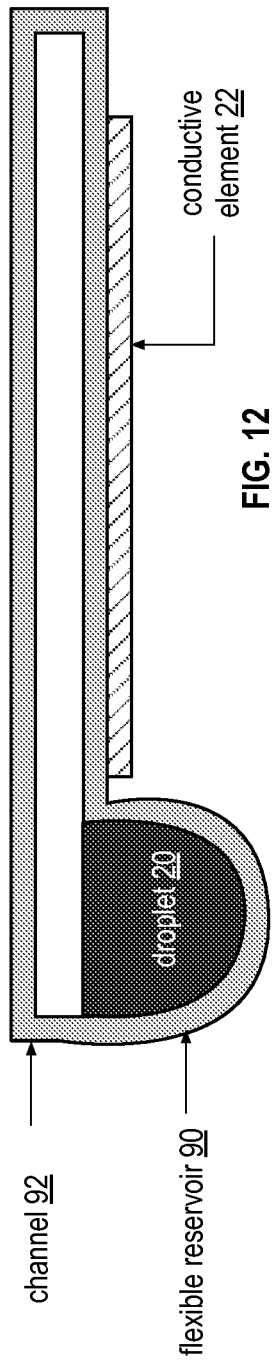
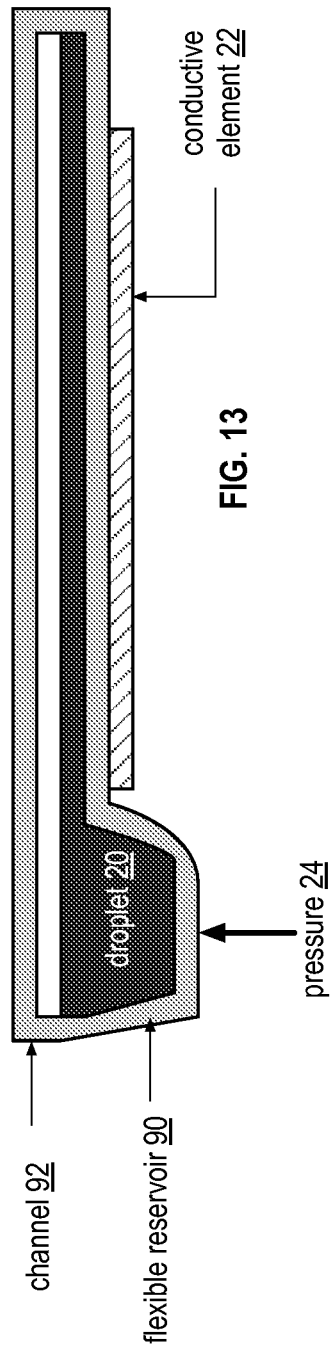

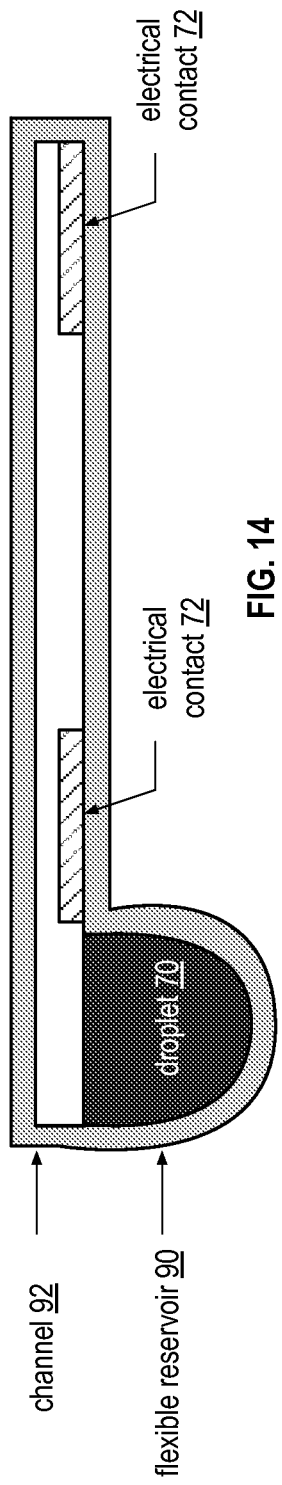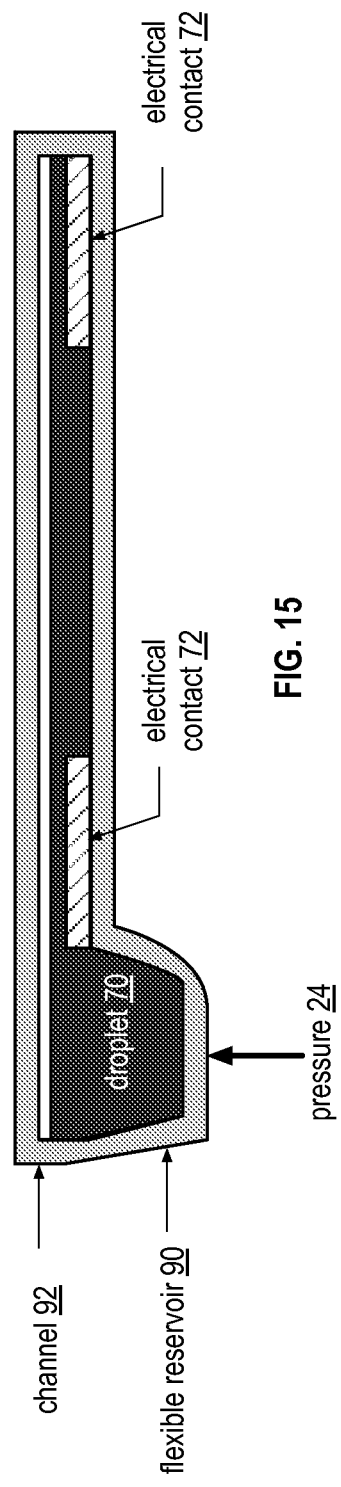

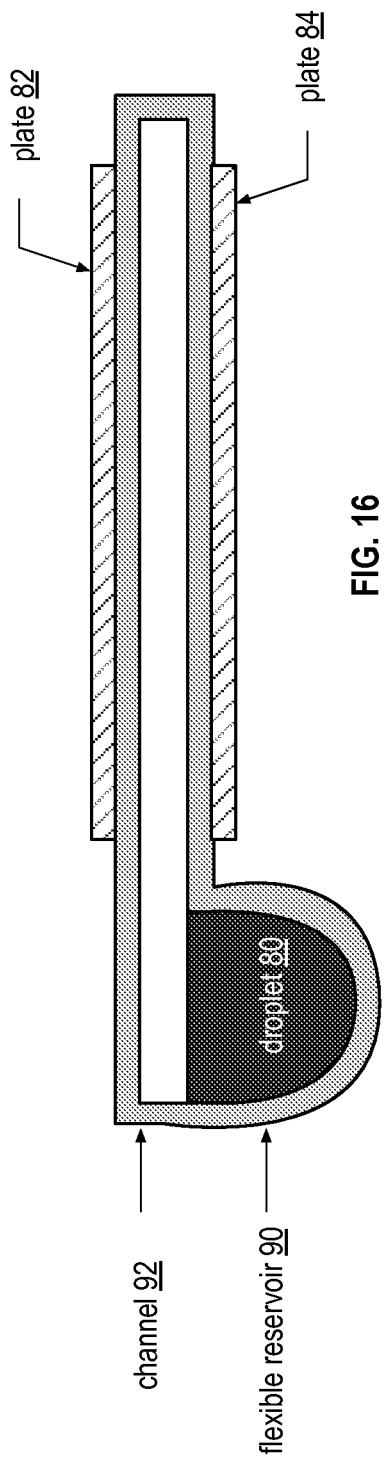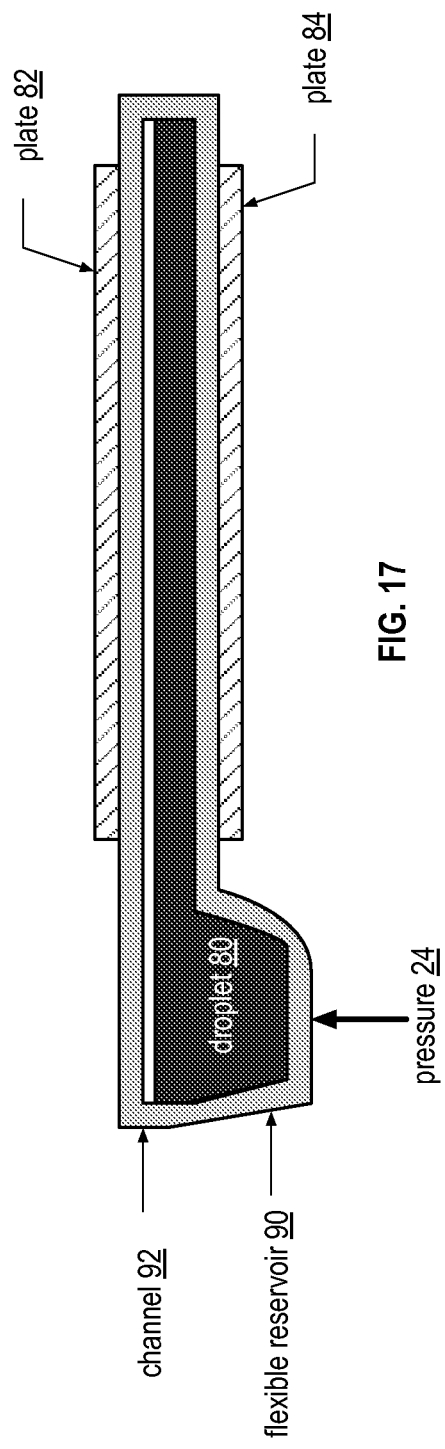

LIQUID MEMS COMPONENT RESPONSIVE TO PRESSURE

CROSS REFERENCE TO RELATED PATENTS

The present U.S. Utility Patent Application claims priority pursuant to 35 U.S.C. §119(e) to the following U.S. Provisional Applications which are incorporated herein by reference in their entirety and made part of the present U.S. Utility Patent Application for all purposes:

1. U.S. Provisional Application No. 61/699,183, entitled "Liquid Micro Electro Mechanical Systems (MEMS) Devices and Applications," filed Sep. 10, 2012; and
2. U.S. Provisional Application No. 61/727,057, entitled "Liquid MEMS Component Responsive to Pressure," filed Nov. 15, 2012.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to radio communications and more particularly to liquid MEMS components that may be used in wireless communication devices.

2. Description of Related Art

Radio frequency (RF) communication devices are known to facilitate wireless communications in one or more frequency bands in accordance with one or more wireless communication protocols or standards. To accommodate multiple communication protocols, or standards, an RF communication device includes multiple versions (one for each protocol) of each section of the RF communication device (e.g., baseband processing, RF receiver, RF transmitter, antenna interface) and/or includes programmable sections. For example, an RF communication device may include a programmable baseband section, multiple RF receiver sections, multiple RF transmitter sections, and a programmable antenna interface.

To provide at least some of the programmable capabilities of a programmable section of an RF communication device, the section includes one or more programmable circuits, wherein the programmability is achieved via a switch-based bank of circuit elements (e.g., capacitors, inductors, resistors). For instance, selecting various combinations of a switch-based bank of capacitors and switch-based bank of inductors yields various resonant tank circuits that can be used in filters, as loads in amplifiers, etc. A recent advance in RF technology is to use integrated circuit (IC) micro-electromechanical system (MEMS) switches to provide the switches of a switch-based bank of circuit elements.

Issues with IC MEMS switches include minimal contact areas (which creates heat spots), bouncing of electrical contact (which limits use to cold switching), and a limited life cycle. In response to these issues, more recent advances in RF technology employ IC implemented liquid RF MEMS switches (which may also be referred to as electro-chemical wetting switches). As IC fabrication technologies continue to evolve and reduce the size of IC dies and components fabricated thereon, IC implemented liquid RF MEMS switches may have limited applications.

BRIEF DESCRIPTION OF THE SEVERAL VIEWS OF THE DRAWING(S)

FIGS. 2 and 3 are schematic block diagrams of an embodiment of a pressure sensitive liquid MEMS component in accordance with the present invention;

FIG. 6 is a schematic block diagram of another embodiment of a pressure sensitive liquid MEMS component in accordance with the present invention;

FIG. 7 is a schematic block diagram of another embodiment of a pressure sensitive liquid MEMS component in accordance with the present invention;

FIGS. 8 and 9 are schematic block diagrams of an embodiment of a pressure sensitive liquid MEMS switch in accordance with the present invention;

FIGS. 12 and 13 are schematic block diagrams of an embodiment of a pressure sensitive liquid MEMS component in accordance with the present invention;

FIGS. 14 and 15 are schematic block diagrams of another embodiment of a pressure sensitive liquid MEMS switch in accordance with the present invention;

FIGS. 16 and 17 are schematic block diagrams of another embodiment of a pressure sensitive liquid MEMS capacitor in accordance with the present invention;

DETAILED DESCRIPTION OF THE INVENTION

Figure 1:
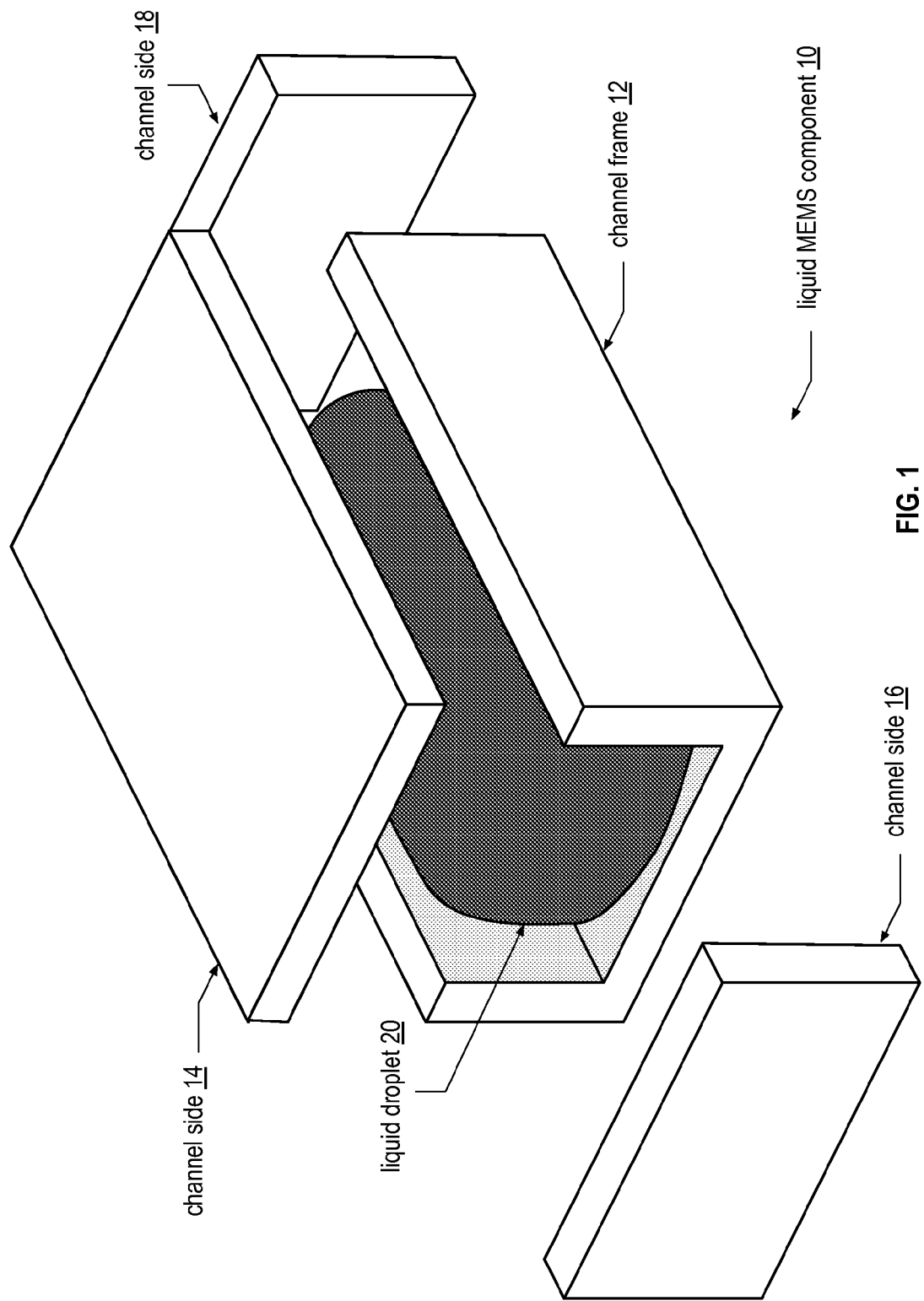
FIG. 1 is a schematic block diagram of an embodiment of a liquid MEMS component in accordance with the present invention.

FIG. 1 is a schematic block diagram of an embodiment of a liquid MEMS component 10, which is fabricated or embedded in a board (not shown). The liquid MEMS component 10 includes a channel frame 12, a first channel side 14, a second channel side 16, a third channel side 18, a liquid droplet 20, one or more conductive elements (not shown in this figure). The channel frame 12 and the channel sides 14-18 form a channel, which contains the liquid droplet 20. One or more of the channel sides 14-18 are flexible to allow a pressure to be applied on the liquid droplet 20. The liquid droplet 20 may be one or more of an electrically conductive droplet (e.g., mercury or other metal or electrically conductive substance that is in a liquid state at room temperature), a liquid insulating droplet, a dielectric doped droplet, a ferrite doped droplet, or other type. The channel frame 12 and the channel sides 14-18 are of a material that does not chemically react to the droplet 20 and, at least for one side, is flexible. For instance, the channel frame 12 and the channel sides 14-18 may be plastic, fiberglass, FR 4 material, carbon fiber, etc.

The liquid MEMS component 10 may be used in a variety of devices, such as a portable computing communication device, a touch sensitive device, a remote control device, a keyboard, a key pad, a video gaming unit, etc. A portable computing communication device may be any device that can be carried by a person, can be at least partially powered by a battery, includes a radio transceiver (e.g., radio frequency (RF) and/or millimeter wave (MMW)) and performs one or more software applications. For example, the portable computing communication device may be a cellular telephone, a laptop computer, a personal digital assistant, a video game console, a video game player, a personal entertainment unit, a tablet computer, etc.

With a wide variety of applications, the size of the liquid MEMS component 10 may range dramatically. For example, when a finger applies the pressure, the size of the channel may be one or more centimeters by one or more centimeters. As another example, when an actuator applies the pressure, the size of the channel may be a fraction of a millimeter by a fraction of a millimeter. In addition, the liquid MEMS component 10 is fabricated or embedded on a board (e.g., printed circuit board, integrated circuit package substrate, etc.) while a majority of the circuitry of a device is implemented on one or more integrated circuit (IC) dies. For instance, activation circuitry and/or interpreting circuit associated with the liquid MEMS component 10 may be implemented on an IC die and the liquid MEMS component 10 is implemented or embedded on a board. Further, the board may support the one or more IC dies of a device.

In an example of operation, a pressure is applied on the one or more flexible channel sides 14-18, which compresses the inside of the channel and changing the shape of the liquid droplet 20. With the shape of the droplet 20 changing, its positioning with respect to the one or more conductive elements is changed, which, in turn, changes an operational characteristic of the liquid MEMS component 10. Various examples of the liquid MEMS component 10 are discussed with reference to one or more of the subsequent figures.

FIGS. 2 and 3 are schematic block diagrams of an embodiment of a pressure sensitive liquid MEMS component 10 that includes a board 11, a channel frame 12, a flexible channel side 14, a liquid droplet 20, and a conductive element 22. The channel frame 12 and the flexible channel side 14 form a channel that contains the liquid droplet 20. The board 11 includes a printed circuit board (PCB), an integrated circuit (IC) package substrate, and/or a redistribution layer (RDL) of a PCB or of an IC package substrate. Note that the channel is fabricated or embedded in one or more layers of the board 11. Further note that the channel may have a variety of shapes. For example, the channel may have a square-tubular shape, a cylinder shape, a non-linear square-tubular shape, or a non-linear cylinder shape, where non-linear refers to the axial shape of the channel being something other than a straight line (e.g., a meandering line, an arc, a circle, an ellipse, a polygon, or a portion thereof). In addition, the channel may have its internal and/or external walls coated with an insulating layer, dielectric layer, a semiconductor layer, and/or a conductive layer.

As shown in FIG. 2, minimal to no pressure is applied on the flexible channel side 14, as such, the droplet 20 has an un-modified shape and a first positioning with respect to the conductive element 22. As shown in FIG. 3, as pressure 24 is applied on the flexible channel side 14, the shape of droplet 20 changes, thereby changing its positioning with respect to the conductive element 22. As the positioning of the droplet 20 changes with respect to the conductive element 22, an operational condition of the liquid MEMS component 10 changes. Various examples of specific types of liquid MEMS components 10 are discussed with reference to one or more of the subsequent figures.

Figure 4:
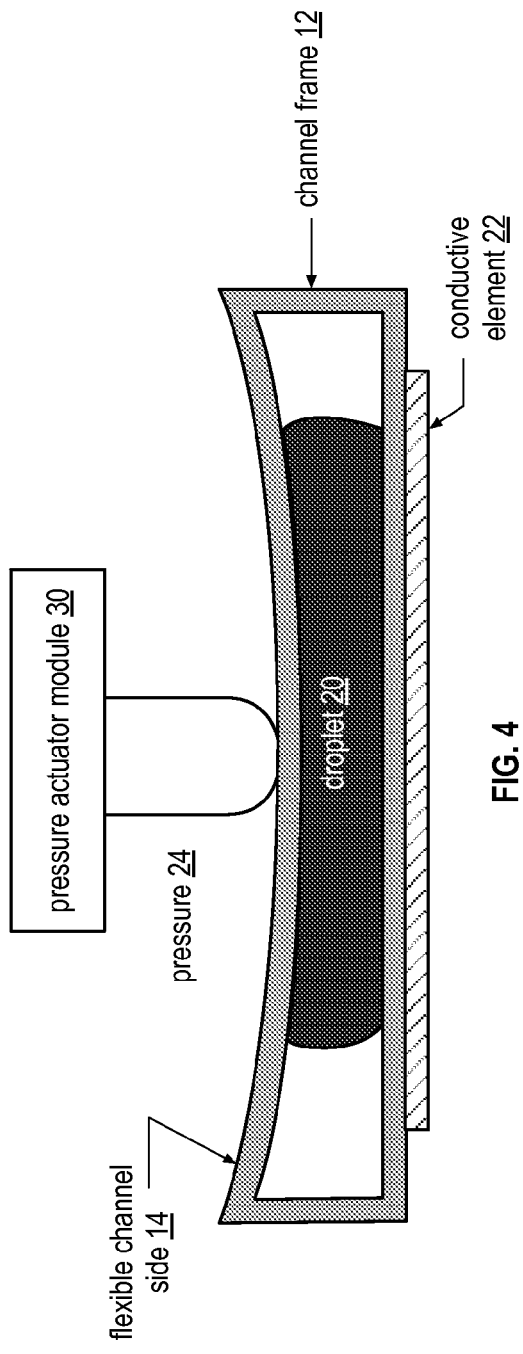
FIG. 4 is a schematic block diagram of another embodiment of a pressure sensitive liquid MEMS component in accordance with the present invention.

FIG. 4 is a schematic block diagram of another embodiment of a pressure sensitive liquid MEMS component 10 where the pressure 24 is applied by a pressure actuator module 30. The pressure actuator module 30 may be an electric field source, a magnetic field source, a heat source, a compression source, and/or an expansion source to apply the pressure 24 (e.g., an electric field, a magnetic field, heat, compression, etc.) on the flexible channel side 14 to actuate, alter, move, compress, expand, etc. the droplet 20 to facilitate the characteristic change of the liquid MEMS component 10. Note that the flexible channel side 14 may be of a material that responds to an electric field, a magnetic field, compression, an actuator, etc. For example, the flexible channel side 14 may be constructed from a flexible plastic that is embedded with magnets that are repelled, or are attracted, in response to a magnetic field. As another example, the flexible channel side 14 may be constructed from a material (e.g., a metal, plastic, etc.) that expands in the presence of a heat source.

Figure 5:
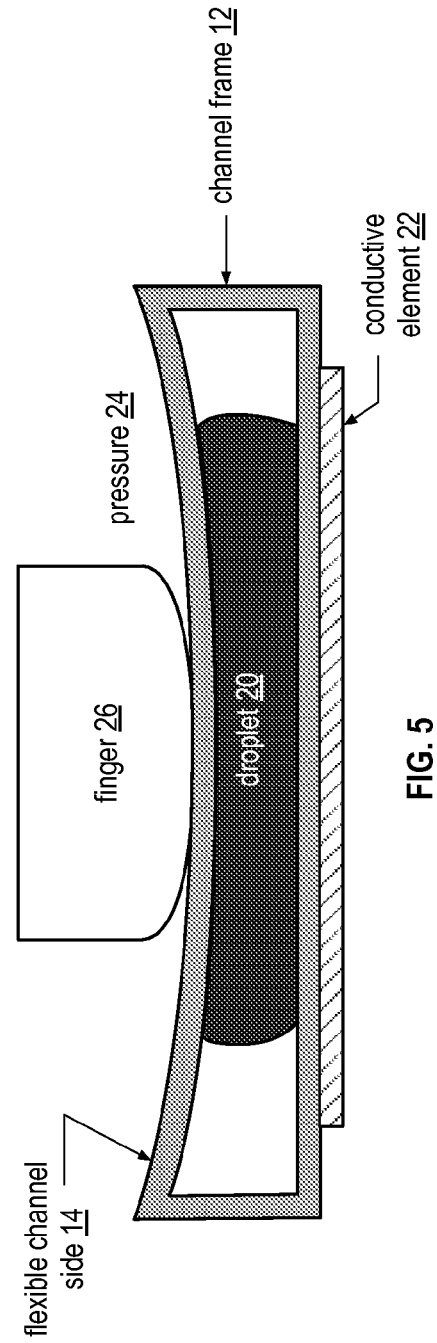
FIG. 5 is a schematic block diagram of another embodiment of a pressure sensitive liquid MEMS component in accordance with the present invention.

FIG. 5 is a schematic block diagram of another embodiment of a pressure sensitive liquid MEMS component 10 where the pressure 24 is applied by a finger 26. In this embodiment, the size of the liquid MEMS component 10 is sufficient to accommodate the pressure 24 being applied by a finger 26. As the finger 26 compresses the flexible channel side 14, the shape of the droplet is changed with respect to the one or more conductive elements 22.

FIG. 6 is a schematic block diagram of another embodiment of a pressure sensitive liquid MEMS component 10 and a pressure actuator module 30. The pressure actuator module 30 includes a second droplet 40, a second channel 46, a piston 48, and a droplet actuation module 42. The board 11 supports both the liquid MEMS component 10 and the pressure actuator module 30. The droplet actuation module 42 may be implemented in the board 11 or supported by the board 11. Note that the second droplet 40 may be one or more of an expanding liquid droplet that expands in response to the force of the droplet actuation module, a contracting liquid droplet that contracts in response to the force of the droplet actuation module, a repelling liquid droplet that is repelled in response to the force of the droplet actuation module, and an attraction liquid droplet that is attracted in response to the force of the droplet actuation module.

In an example of operation, the droplet actuation module 42 applies a force 44 to expand or contract the second droplet 40. For instance, the droplet actuation module 42 may be an electric field source, a magnetic field source, a heat source, a compression source, and/or an expansion source to apply a force 44 (e.g., an electric field, a magnetic field, heat, compression, etc.) on the second droplet 40 to expand or contract the second droplet 40. As the second droplet 40 expands, which may occur when the force 44 is increased, the droplet 40 pushes the piston 48 outward. The piston 48 applies a transferred force 50 on the flexible channel side 14 thereby changing the shape of the droplet 20. When the force 44 is reduced, the second droplet 40 contracts, thereby reducing the force on the piston 48 and the transferred force 50 on the flexible channel side 14. Alternatively, the droplet 40 may contract as the force 44 is increased and it expands as the force 44 is decreased.

FIG. 7 is a schematic block diagram of another embodiment of a pressure sensitive liquid MEMS component 10 where the pressure 24 is applied by a finger 26 (e.g., user contact) via a size convergence unit 60. In this embodiment, the size of the liquid MEMS component 10 is too small to accommodate the pressure 24 being applied by a finger 26 directly. As such, the size convergence unit 60, which may be comprised on plastic, metal, etc., focuses the force of the finger 26 on to the flexible channel side 14. The transferred force applies pressure 24 on the flexible channel side 14, which changes the shape of the droplet 20 with respect to the one or more conductive elements 22.

FIGS. 8 and 9 are schematic block diagrams of an embodiment of a pressure sensitive liquid MEMS component 10 being a switch. The switch includes an electrically conductive droplet 70 (e.g., mercury or other metal or electrically conductive substance that is in a liquid state at room temperature), the channel frame 12, the flexible channel side 14, and a pair of electrical contacts 72. The droplet 70 changes its shape as the pressure 24 is applied. As shown in FIG. 8, when a minimal pressure 24 is applied, the droplet 70 is not in contact with one or more of the electrical contracts 72. As such the switch is open. When, as shown in FIG. 9, a sufficiently large pressure 24 is applied, the shape of the droplet 70 changes causing it to make contact with the electrical contracts 72. As such, the switch is closed.

Figure 10:
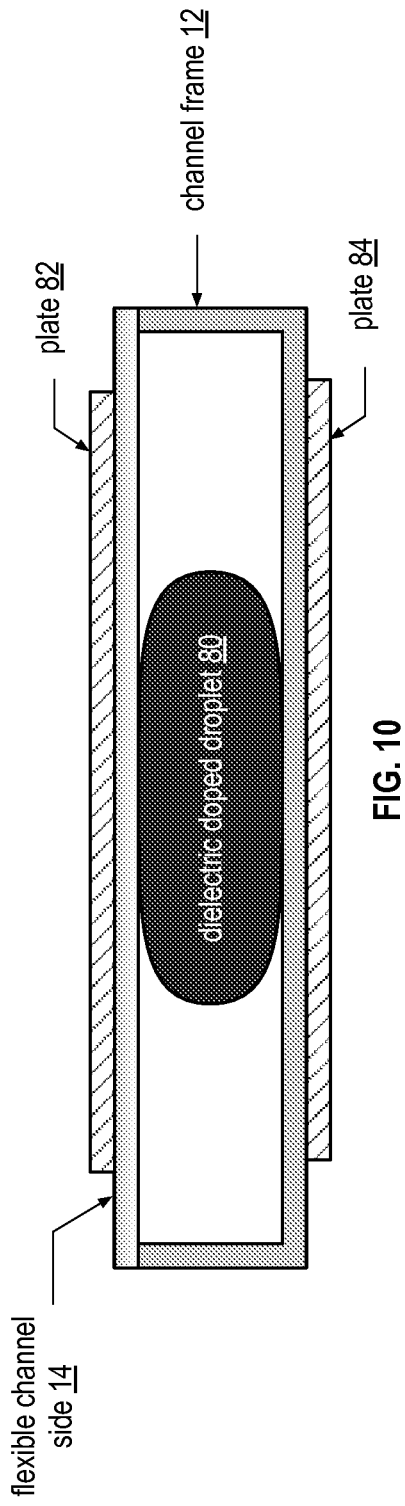
FIGS. 10 and 11 are schematic block diagrams of an embodiment of a pressure sensitive liquid MEMS capacitor in accordance with the present invention.
Figure 11:
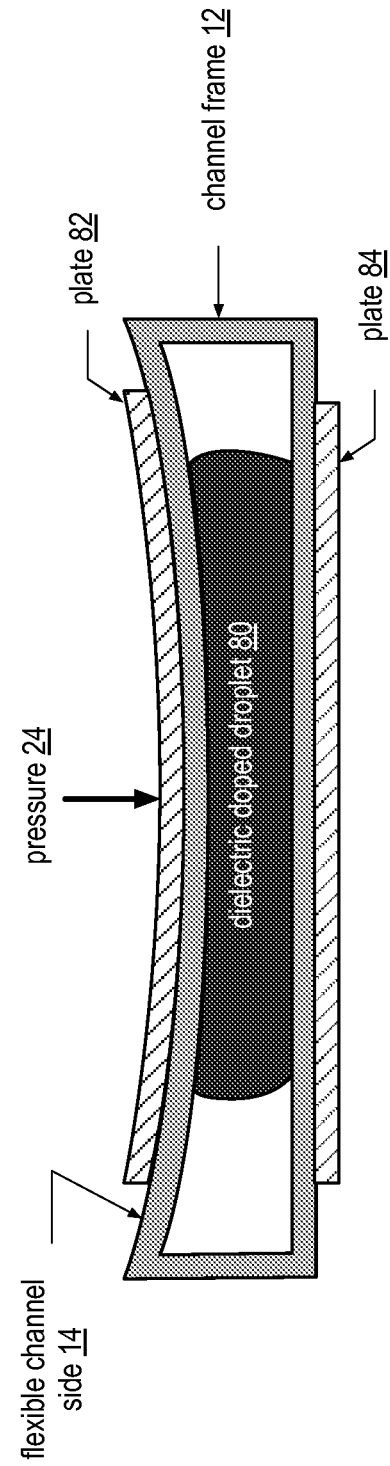

FIGS. 10 and 11 are schematic block diagrams of an embodiment of a pressure sensitive liquid MEMS component 10 being an adjustable capacitor (i.e., a varactor). The capacitor includes the channel frame 12 and the flexible channel side 14 forming a channel, a dielectric doped droplet 80, a first capacitor plate 82 and a second capacitor plate 84.

The dielectric doped droplet 80 is contained in the channel and the first and second plates 82 84 are proximally positioned to the channel (e.g., on opposite surfaces of the channel) and are at a distance (d) from each other. As shown in FIG. 10, with minimal to no pressure on the flexible channel side 14, the dielectric-doped droplet 80 has a first size and/or shape within the channel and/or a first positioning with respect to the plates 82 84. As shown in FIG. 11, when pressure 24 is applied on the flexible channel side 14, the dielectric-doped droplet 80 has a second size and/or shape within the channel and/or a second positioning with respect to the plates 82 84. Modifying the dielectric-doped droplet 80 with respect to the first and second plates 82 84 causes a change in a dielectric property (e.g., effective distance, effective area of overlap, permittivity, capacitance, etc.) of the liquid MEMS capacitor.

As an example, the dielectric doped droplet 80 is a solution that includes suspending dialectic particles and its shape, size, and/or position changes in the presence of a pressure 24. For example, with a minimal (or inactive) pressure 24 applied, the droplet 80 is in a contracted shape, which provides a first dielectric property for a liquid MEMS capacitor (i.e., the droplet 80 has the first shape, size, and/or positioning with respect to the plates 82 84). When a sufficiently large (or active) pressure 24 is applied, the shape, size, and/or position of the droplet 80 change, which changes the dielectric properties of the capacitor. Note that the capacitance of a capacitor is $C = \in_r \in_0 (A/d)$, where C is the capacitance, A is the area of overlap of the two plates, $\in_r$ is the relative static permittivity (e.g., dielectric constant) of the material between the plates, $\in_0$ is the electric constant, and d is the distance between the two plates. As such, by changing the dielectric properties, the dielectric constant is changed, which proportionally changes the capacitance of the liquid MEMS capacitor. Note that while one of the capacitor plates 82 and 84 is shown on the flexible channel side 14, the plates 82 and 84 may be on other, non-flexible, sides of the channel.

FIGS. 12 and 13 are schematic block diagrams of an embodiment of a pressure sensitive liquid MEMS component 10 that includes a board 11 (not shown in the present figure), a liquid droplet 20, a channel 92, a flexible reservoir 90, and one or more conductive elements 22 (e.g., capacitor plates, switch contacts, inductor winding, etc.). Note that the channel 92 is fabricated or embedded in one or more layers of the board 11. Further note that the channel 92 may have a variety of shapes. For example, the channel 92 may have a square-tubular shape, a cylinder shape, a non-linear square-tubular shape, or a non-linear cylinder shape, where non-linear refers to the axial shape of the channel being something other than a straight line (e.g., a meandering line, an arc, a circle, an ellipse, a polygon, or a portion thereof). In addition, the channel 92 may have its internal and/or external walls coated with an insulating layer, dielectric layer, a semiconductor layer, and/or a conductive layer.

The droplet 20 is contained in the flexible reservoir 90 and, when minimal pressure is applied on the reservoir 90 as shown in FIG. 12, the droplet 20 remains in the reservoir 90. When a pressure 24 is applied on the reservoir 90 as shown in FIG. 13, the droplet 20 is forced in the channel 92. As the droplet 20 enters and exits the channel 92, and at what levels, one or more operational characteristics of the liquid MEMS component 10 are changed. For example, the dielectric properties of a capacitor are changed as the droplet 20 enters and exits the channel 92. As another example, on/off states of switch changes as the droplet 20 enters and exits the channel 92. Note that the pressure 24 may be applied via a size convergence unit 60 or a pressure actuator module 30.

FIGS. 14 and 15 are schematic block diagrams of another embodiment of a pressure sensitive liquid MEMS 10 being a switch. The switch includes an electrically conductive droplet 70 (e.g., mercury or other metal or electrically conductive substance that is in a liquid state at room temperature), the channel 92, and a pair of electrical contacts 72. The droplet 70 changes its shape as the pressure 24 is applied. As shown in FIG. 14, when a minimal pressure 24 is applied, the droplet 70 is not in contact with one or more of the electrical contracts 72. As such the switch is open. When, as shown in FIG. 15, a sufficiently large pressure 24 is applied on the reservoir 90, the shape of the droplet 70 changes causing it to make contact with the electrical contracts 72. As such, the switch is closed.

FIGS. 16 and 17 are schematic block diagrams of another embodiment of a pressure sensitive liquid MEMS 10 being an adjustable capacitor (i.e., a varactor). The capacitor includes the channel 92, a dielectric doped droplet 80, a first capacitor plate 82 and a second capacitor plate 84. The dielectric doped droplet 80 is contained in the channel 92 and the first and second plates 82 84 are proximally positioned to the channel 92 (e.g., on opposite surfaces of the channel) and are at a distance (d) from each other. As shown in FIG. 16, with minimal to no pressure on the flexible reservoir 90, the dielectric-doped droplet 80 remains in the reservoir 90 and, as such, has a first size and/or shape within the channel 92 and/or a first positioning with respect to the plates 82 84. As shown in FIG. 17, when pressure 24 is applied on the flexible reservoir 90, the dielectric-doped droplet 80 enters the channel 92 and, as such, has a second size and/or shape within the channel 92 and/or a second positioning with respect to the plates 82 84. Modifying the dielectric-doped droplet 80 with respect to the first and second plates 82 84 causes a change in a dielectric property (e.g., effective distance, effective area of overlap, permittivity, capacitance, etc.) of the liquid MEMS capacitor.

Figure 18:
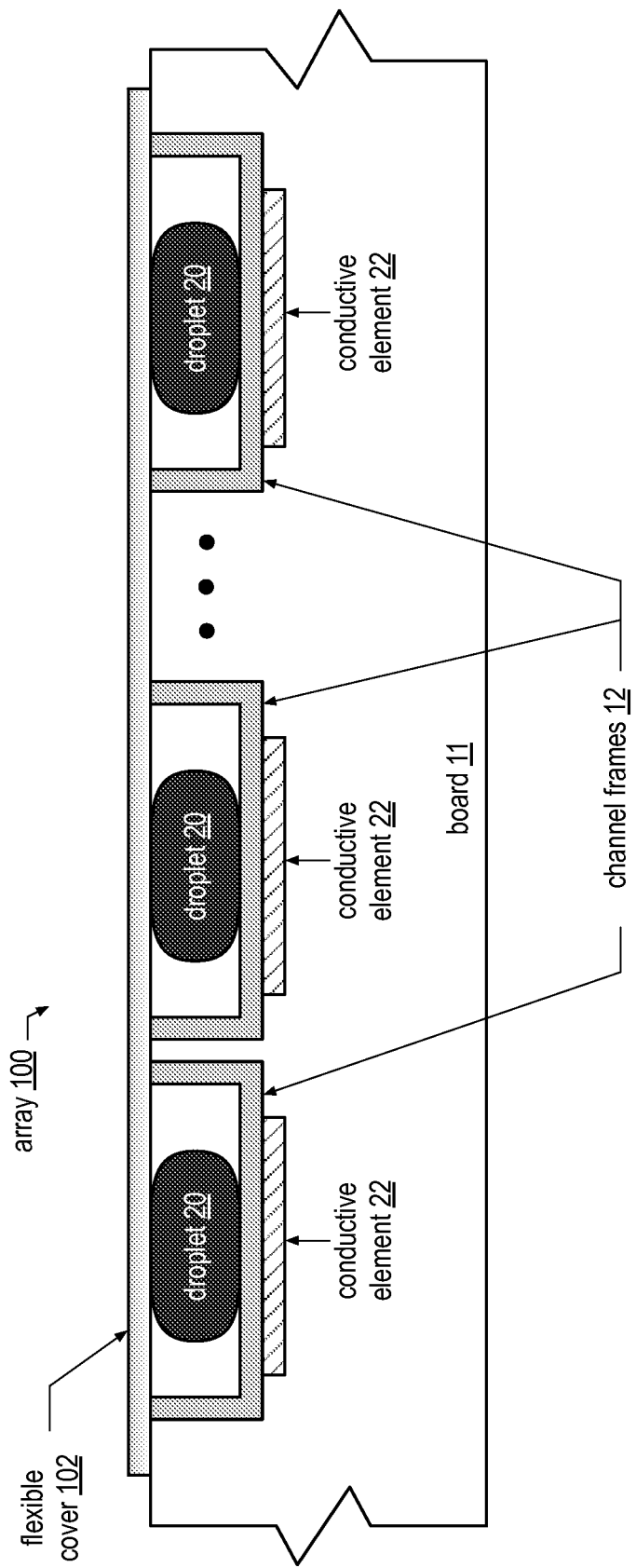
FIG. 18 is a schematic block diagram of an embodiment of an array of pressure sensitive liquid MEMS components in accordance with the present invention.

FIG. 18 is a schematic block diagram of an embodiment of an array 100 of pressure sensitive liquid MEMS components. The array 100 includes a board 11, a plurality of channel frames 12, a flexible cover 102, a plurality of liquid droplets 20, and a plurality of sets of conductive elements 22 (e.g., capacitor plates, switch contacts, etc.). Each channel frame 12 contains one of the liquid droplets 20 and has associated therewith a set of conductive elements 22. The flexible cover 102 mates with each of the channel frames 12 to produce a plurality of channels. When a pressure is applied to the flexible cover 102, the shape of one or more liquid droplets is changed with respect to corresponding sets of conductive elements thereby changing an operational characteristic of one or more liquid MEMS components of the array 100 of liquid MEMS components.

In an example of operation, the liquid MEMS components may be switches (FIGS. 8 & 9) and/or capacitors (FIGS. 10 & 11). As a pressure is applied on the flexible cover 102, the shape of one or more droplets 20 is changed, which may cause a switch to close or to the capacitance of a variable capacitor to change. The change in an operational characteristic (e.g., switch on or off, change in capacitance, etc.) of one or more liquid MEMS components is detected and may be interpreted as a user input of a touch screen, a keypad, a keyboard, etc.

Figure 19:
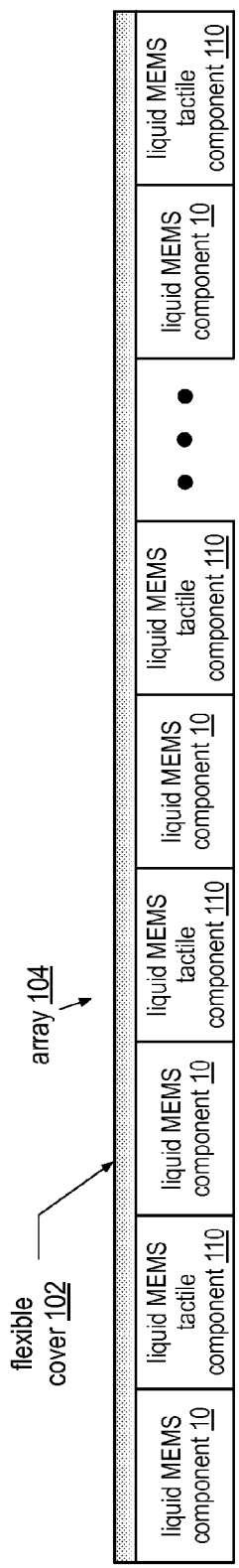
FIG. 19 is a schematic block diagram of an embodiment of an array of pressure sensitive liquid MEMS components and liquid MEMS tactile components in accordance with the present invention.

FIG. 19 is a schematic block diagram of an embodiment of an array 104 of pressure sensitive liquid MEMS components and liquid MEMS tactile components. The pressure sensitive liquid MEMS components may be switches and/or capacitors as previously discussed. The liquid MEMS tactile components may be interspersed among the plurality of pressure sensitive liquid MEMS components to provide a tactile feedback on a touchscreen, keypad, a keyboard, etc. The pressure sensitive liquid MEMS components may be implemented as discussed with reference to FIGS. 20 and 21.

Figure 20:
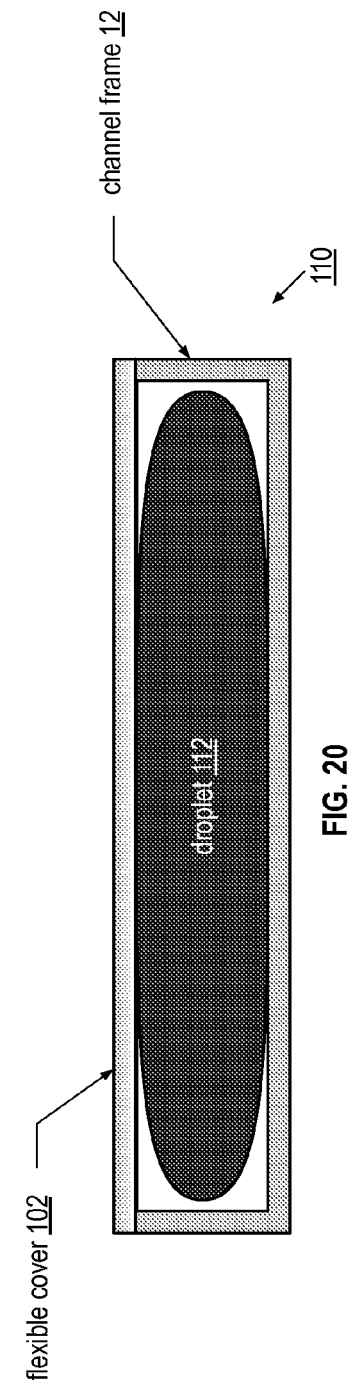
FIGS. 20 and 21 are schematic block diagrams of an embodiment of a liquid MEMS tactile component in accordance with the present invention.
Figure 21:
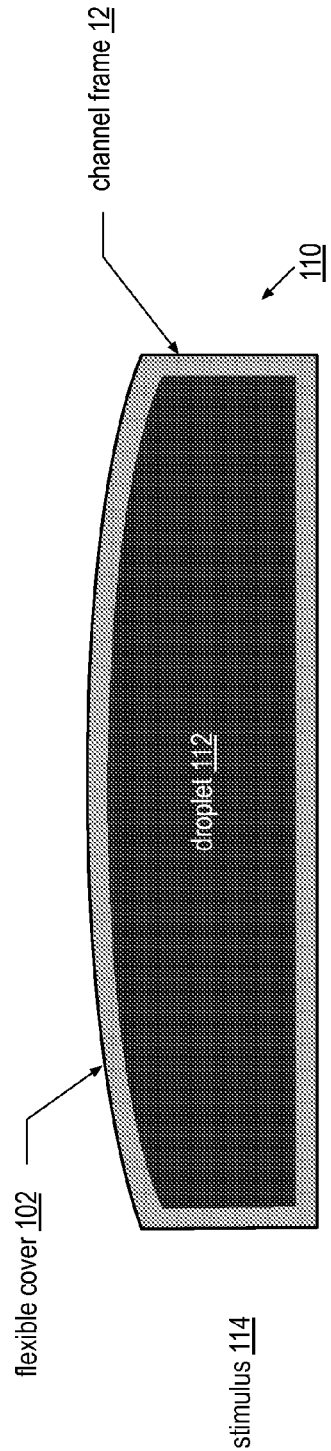

FIGS. 20 and 21 are schematic block diagrams of an embodiment of a liquid MEMS tactile component 110 that includes the channel frame 12, which is in the board 11, and a droplet 112. The flexible cover 102 mates with the channel frame 12 to provide a channel, which contains the droplet 112. The droplet 112 responds to a stimulus 114 to apply an outward pressure on the flexible cover 102 as a tactile response to the stimulus 114.

A droplet activating module may generate the stimulus 114 for one or more of the liquid MEMS tactile components to provide a tactile response. The droplet activating module may be an electric field source, a magnetic field source, a heat source, and/or an expansion source to apply the stimulus (e.g., an electric field, a magnetic field, heat, compression, etc.) on the droplet 112 to expand it. Note that the droplet 112 may be an expanding liquid droplet that expands in response to the stimulus of the droplet activating module and/or a contracting liquid droplet that contracts in response to the stimulus of the droplet activating module and expands in the absence of the stimulus.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A liquid micro-electro-mechanical system (MEMS) component comprises:
    a board;
    a channel frame within the board;
    a flexible channel side mating with the channel frame to form a channel within the board;
    a liquid droplet contained within the channel;
    two conductive elements contained within the channel, wherein when pressure is applied to the flexible channel side the liquid droplet elongates to make contact with both of the two conductive elements, wherein when pressure is not applied to the flexible channel side the liquid droplet does not make contact with at least one of the two conductive elements, and wherein the liquid MEMS component functions as a switch; and
    a pressure actuator having:
        a second channel within the board;
        a second liquid droplet within the second channel;
        a piston movably positioned within the second channel; and
        a droplet actuation module configured to apply a force on the second liquid droplet that causes the second liquid droplet to apply a transferred force on the piston, which, in turn, causes the piston to apply pressure on the flexible channel side.

2. The liquid MEMS component of claim 1, wherein the two conductive elements are spaced apart within the channel.

3. The liquid MEMS component of claim 1, wherein the liquid droplet comprises a liquid metal.

4. The liquid MEMS component of claim 1, wherein the board comprises one of:
    a printed circuit board (PCB);
    an integrated circuit (IC) package substrate; and
    a redistribution layer (RDL) of a PCB or of an IC package substrate.

5. The liquid MEMS component of claim 1 further comprises:
    a second flexible side mating with the channel frame to form the channel, wherein, when the pressure is applied to at least one of the flexible side and the second flexible side, the shape of the liquid droplet is changed with respect to the two conductive elements thereby changing operational characteristic of the liquid MEMS component.

6. A liquid micro-electro-mechanical system (MEMS) component comprises:
    a board;
    a channel within the board;
    a flexible reservoir mechanically coupled to the channel at a first end of the channel;
    a liquid droplet contained in the flexible reservoir;
    two conductive elements disposed within the channel, wherein, when pressure is applied to the flexible reservoir, the liquid droplet is forced into the channel thereby creating a conductive path between the two conductive elements, and wherein when no pressure is applied to the flexible reservoir the liquid droplet remains substantially in the flexible reservoir such that no conducive path exists between the two conductive elements; and a liquid MEMS mechanical device that includes:
- a second channel within the board;
- a second liquid droplet within the second channel;
- a piston movably positioned within the second channel; and
- a droplet actuation module operable to apply a force on the second liquid droplet that causes the second liquid droplet to apply a transferred force on the piston, which, in turn, causes the piston to apply the pressure on the flexible reservoir.

7. The liquid MEMS component of claim 6, wherein the two conductive elements are spaced apart in the channel and the liquid MEMS component functions as a switch.

8. The liquid MEMS component of claim 6, wherein the liquid droplet comprises a liquid metal.

9. The liquid MEMS component of claim 6, wherein the board comprises one of:
- a printed circuit board (PCB);
- an integrated circuit (IC) package substrate; and
- a redistribution layer (RDL) of a PCB or of an IC package substrate.

10. An array of liquid micro-electro-mechanical system (MEMS) components comprises:
- a board;
- a plurality of channel frames within the board;
- a flexible cover mating with the plurality of channel frames to form a plurality of channels within the board;
- a plurality of liquid droplets, wherein each liquid droplet of the plurality of droplets is contained within a respective channel of the plurality of channels; and
- a plurality of pairs of conductive elements, wherein each pair of conductive elements of the plurality of sets of conductive elements resides within a corresponding channel, wherein, when pressure is applied to the flexible cover at a corresponding location, a corresponding liquid droplet elongates to make contact with both of a corresponding pair of conductive elements and wherein when pressure is not applied to the flexible cover at the corresponding location the corresponding liquid droplet does not make contact with at least one of the corresponding pair of conductive elements.

11. The array of liquid MEMS components of claim 10, wherein the plurality of pairs of conductive elements are spaced apart within corresponding channels.

12. The array of liquid MEMS components of claim 10 further comprises:
- a second plurality of channel frames within the board, wherein the flexible cover mates with the second plurality of channel frames to form a second plurality of channels within the board; and
- a second plurality of liquid droplets, wherein individual droplets of the second plurality of liquid droplets are contained within corresponding individual channels of the second plurality of channels, wherein in response to a stimulus, the shape of one or more of the plurality of liquid droplets are changed to apply an outward pressure on the flexible cover as a tactile response to the stimulus.

13. The array of liquid MEMS components of claim 10, wherein the plurality of liquid droplets comprise liquid metal.

14. The array of liquid MEMS components of claim 10, wherein the array of liquid MEMS components functions as a set of switches.

15. The array of liquid MEMS components of claim 10, wherein the board comprises one of:
- a printed circuit board (PCB);
- an integrated circuit (IC) package substrate; and
- a redistribution layer (RDL) of a PCB or of an IC package substrate.

16. The array of liquid MEMS components of claim 10, further comprising a size convergent unit configured to transfer external pressure to at least one corresponding portion of the flexible cover.

17. The array of liquid MEMS components of claim 10, further comprising a plurality of size convergence units, each of the plurality of size convergence units respective to a corresponding channel of the plurality of channels and configured to transfer external pressure to a corresponding portion of the flexible cover.

18. The array of liquid MEMS components of claim 10, where the plurality of channels form a touch sensitive array.

19. The array of liquid MEMS components of claim 18, where the plurality of channels form a touch sensitive array is spaced apart in two dimensions.

20. The array of liquid MEMS components of claim 10, further comprising a flexible reservoir corresponding to a respective channel.

* * * * *